(12) United States Patent
Cooper et al.

(10) Patent No.: US 8,778,210 B2
(45) Date of Patent: Jul. 15, 2014

(54) COMPOSITIONS AND METHODS FOR THE SELECTIVE REMOVAL OF SILICON NITRIDE

(75) Inventors: Emanuel I. Cooper, Scarsdale, NY (US); Eileen R. Sparks, Clarksburg, MD (US); William R. Bowers, Georgetown, TX (US); Mark A. Biscotto, Burnet, TX (US); Kevin P. Yanders, Germansville, PA (US); Michael B. Korzenski, Danbury, CT (US); Prerna Sonthalia, Mumbai (IN); Nicole E. Thomas, Brewster, NY (US)

(73) Assignee: Advanced Technology Materials, Inc., Danbury, CT (US)

( * ) Notice: Subject to any disclaimer, the term of this patent is extended or adjusted under 35 U.S.C. 154(b) by 922 days.

(21) Appl. No.: 12/520,138

(22) PCT Filed: Dec. 21, 2007

(86) PCT No.: PCT/US2007/088643
§ 371 (c)(1),
(2), (4) Date: Mar. 2, 2010

(87) PCT Pub. No.: WO2008/080096
PCT Pub. Date: Jul. 3, 2008

(65) Prior Publication Data
US 2010/0176082 A1    Jul. 15, 2010

Related U.S. Application Data

(60) Provisional application No. 60/871,391, filed on Dec. 21, 2006.

(51) Int. Cl.
| | | |
|---|---|---|
| *C03C 15/00* | (2006.01) |
| *C03C 25/68* | (2006.01) |
| *C09K 13/00* | (2006.01) |
| *C09K 13/04* | (2006.01) |
| *C09K 13/08* | (2006.01) |
| *C09K 13/06* | (2006.01) |

(52) U.S. Cl.
USPC ............... 216/88; 216/83; 216/89; 216/90; 216/91; 252/79.1; 252/79.2; 252/79.3; 252/79.4; 438/690; 438/691; 438/692

(58) Field of Classification Search
USPC ............... 216/8–918; 252/79.1–79.4; 438/690–692
See application file for complete search history.

(56) References Cited

U.S. PATENT DOCUMENTS 5,376,236 A * 12/1994 Hanson et al. ............... 216/108
5,976,928 A    11/1999 Kirlin et al.

(Continued)

FOREIGN PATENT DOCUMENTS

| EP | 0989597 A1 | 3/2000 |
| GB | 123894 | * 6/1971 |

(Continued)

OTHER PUBLICATIONS

Molinari et al. "Treatise on general and industrial inorganic chemistry" 1912, P. Blakistons Son & Co, 3rd Ed, p. 397-399.*

(Continued)

*Primary Examiner* — Allan Olsen
*Assistant Examiner* — Margaret D Klunk
(74) *Attorney, Agent, or Firm* — Tristan A. Fuierer; Moore & Van Allen, PLLC; Rosa Yaghmour

(57) ABSTRACT

Compositions useful for the selective removal of silicon nitride materials relative to poly-silicon, silicon oxide materials and/or silicide materials from a microelectronic device having same thereon. The removal compositions include fluorosilicic acid, silicic acid, and at least one organic solvent. Typical process temperatures are less than about 100° C. and typical selectivity for nitride versus oxide etch is about 200:1 to about 2000:1. Under typical process conditions, nickel-based silicides as well as titanium and tantalum nitrides are largely unaffected, and polysilicon etch rates are less than about 1 Å min$^{-1}$.

17 Claims, 3 Drawing Sheets

(56) References Cited

U.S. PATENT DOCUMENTS

| | | | |
|---|---|---|---|
| 5,993,685 | A | 11/1999 | Currie et al. |
| 6,287,983 | B2 | 9/2001 | Jan et al. |
| 6,322,600 | B1 | 11/2001 | Brewer et al. |
| 6,326,130 | B1 | 12/2001 | Schwartzkopf et al. |
| 6,346,741 | B1 * | 2/2002 | Van Buskirk et al. ......... 257/664 |
| 6,395,194 | B1 | 5/2002 | Russell et al. |
| 6,592,980 | B1 | 7/2003 | MacDougall et al. |
| 6,599,370 | B2 | 7/2003 | Skee |
| 6,692,546 | B2 | 2/2004 | Ma et al. |
| 6,800,218 | B2 | 10/2004 | Ma et al. |
| 6,802,983 | B2 | 10/2004 | Mullee et al. |
| 7,029,373 | B2 | 4/2006 | Ma et al. |
| 8,025,811 | B2 * | 9/2011 | Mistkawi et al. ............. 252/79.1 |
| 2003/0157311 | A1 * | 8/2003 | MacDougall et al. ...... 428/304.4 |
| 2004/0172973 | A1 * | 9/2004 | Chen et al. ...................... 65/17.2 |
| 2006/0081460 | A1 * | 4/2006 | Emesh et al. ............. 204/224 M |
| 2007/0235684 | A1 * | 10/2007 | Mistkawi et al. ............. 252/79.1 |
| 2008/0125342 | A1 | 5/2008 | Visintin et al. |
| 2008/0254628 | A1 | 10/2008 | Boggs et al. |
| 2009/0215269 | A1 | 8/2009 | Boggs et al. |
| 2010/0163788 | A1 * | 7/2010 | Visintin et al. ............... 252/79.3 |

FOREIGN PATENT DOCUMENTS

| | | |
|---|---|---|
| GB | 1234894 | 6/1971 |
| JP | 49040844 | 4/1974 |
| JP | 11121442 A | 4/1999 |
| JP | 2000058500 A | 2/2000 |
| JP | 2000133631 A | 5/2000 |
| JP | 2003051469 A | 2/2003 |
| JP | 2005268605 A | 9/2005 |
| TW | 581713 B | 4/2004 |
| WO | 0031794 A1 | 6/2000 |

OTHER PUBLICATIONS

Schmidt et al. "Principles of hydrolysis and condensation reaction of alkoxysilanes" 1984, J. Non-Crystalline Solids, 1-11.*

Deckert et al. "Pattern etching of CVD Si3N4/SiO2 composites in HF/glycerol mixtures" Nov. 1980, J. Electrochem. Soc.:Solid-State Science and Technology, p. 2433-2438.*

Clark, Scott, "Chemical Etching of Silicon Nitride (Si3N4) with Hot Phosphoric Acid (H3PO4)," Silicon Nitride Etch, http://www.bold-tech.com/technical/silicon_nirtide.html.

Van Gelder, W., et al.; "The Etching of Silicon Nitride in Phosphoric Acid with Silicon Dioxide as a Mask," Journal of The Electrochemical Society, 1967, pp. 869-872, vol. 114.

Knotter, D. Martin, et al.; "Performing selective etch of Si3N4 and SiO2 using a single-wafer wet-etch technology," MICRO Magazine.com, http://wwwmicromagazine.com/archive/05/01/knotter.html.

Morosanu, C.-E.; "The Preparation, Characterization and Applications of Silicon Nitride Thin Films," Thin Solid Films, 1980, pp. 171-208, vol. 65.

International Search Report, Sep. 19, 2008.

Harrap, V.; "Equal Etch Rates of Si3N4 and SiO2 Utilizing HF Dilution and Temperature Dependence," The Electrochemical Society, Silicon, 1973, p. 354.

Kern, W., et al.; "The Chemistry of the Semiconductor Industry," 1987, p. 225-280.

Japanese Office Action, Apr. 23, 2012.

* cited by examiner

COMPOSITIONS AND METHODS FOR THE SELECTIVE REMOVAL OF SILICON NITRIDE

CROSS-REFERENCE TO RELATED APPLICATIONS

This application is filed under the provisions of 35 U.S.C. §371 and claims the priority of International Patent Application No. PCT/US07/88643 filed on 21 Dec. 2007 and entitled "Compositions and Methods for the Selective Removal of Silicon Nitride" which claims priority to U.S. Provisional Patent Application No. 60/871,391 filed on 21 Dec. 2006, both of which are hereby incorporated herein by reference in their entirety.

FIELD OF THE INVENTION

The present invention relates to a composition and process for selectively etching silicon nitride in the presence of silicon oxide, polysilicon and/or metal silicides, and more particularly to a composition and process for effectively and efficiently etching a layer of silicon nitride at a high etch rate and with high selectivity with respect to exposed or underlying layers of silicon oxide, polysilicon and/or metal silicides, particularly in a multilayer semiconductor wafer structure.

DESCRIPTION OF THE RELATED ART

With the continued demand for improved device performance there is a continued emphasis on decreasing device dimensions, which provides the dual advantages of dramatically increasing device density as well as improving device performance. Device performance is improved because decreased device dimensions result in shorter paths that need to be traveled by charge carriers, e.g., electrons.

For example, Metal-Oxide-Semiconductor Field-Effect Transistors (MOSFET) gate electrodes have as electrical points of contact the gate surface and the source and drain regions. The distance between the source and drain regions forms the channel length of the gate electrode, and as such, by decreasing device dimensions the channel length is concomitantly decreased. The result is that the switching speed of the device is increased.

It is self evident that reducing device dimensions results in increased packaging density of devices on a microelectronic device chip. This increased packaging density brings with it sharp reductions in the length of the interconnect paths between devices, which reduces the relative negative impact (such as resistive voltage drop, cross talk or RC delay) that these interconnect paths have on overall device performance.

Such requirements however cause problems of increased parasitic capacitance, device contact resistance (gate, source and drain contacts in MOSFET devices), and tight tolerance of pattern definition. For very small sub-micron or sub-half-micron or even sub-quarter-micron modern silicon devices, the conventional photolithographic technique for patterning contacts will not meet the required tolerance of critical dimensions. Methods that have been explored to improve resolution and feature size include the formation of a self-aligned poly-silicon (poly-Si) gate structure, which helps to solve the problem of critical dimension tolerance. Using this method, the contact points that are formed for the source and the drain of the gate electrode self-align with the poly-Si gate.

One problem encountered during the formation of self-aligned gate structures has been the selective removal of silicon nitride materials relative to polysilicon, silicon oxide and/or metal silicide materials. For example, during the anisotropic etching of the silicon nitride layer covering the gate electrodes, the underlying silicon oxide layer and silicon substrate are often damaged as well, causing a deteriorated reliability of a semiconductor device.

Conventional wet etching techniques for selectively removing silicon nitride ($Si_3N_4$) have utilized hot (approximately 145-180° C.) phosphoric acid ($H_3PO_4$) solutions with water, typically 85% phosphoric acid and 15% water (by volume). Using fresh hot phosphoric acid, the typical $Si_3N_4$:$SiO_2$ selectivity is about 40:1. Advantageously, as the nitride layer is removed, hydrated silicon oxide forms, which consistent with Le Châtelier's principle, inhibits the additional removal of silicon oxide from the device surface; thus selectivity gradually increases with use. Disadvantages associated with the use of hot phosphoric acid etches include the corrosion of metal silicide materials, e.g., gate contact materials, the etching of silicon oxide, and process control due to the difficulty associated with maintaining a specific amount of water in the process solution. In addition, hot phosphoric acid has been a difficult medium to adapt to single wafer tools, which have become increasingly preferred by many manufacturers.

Another way to selectively remove silicon nitride includes the use of a composition including hydrofluoric acid, however, said compositions also remove silicon oxides. A $Si_3N_4$:$SiO_2$ selectivity of about 10:1 can be achieved through dilution, however, the etch rate of silicon nitride is compromised or above-ambient pressure must be used. Still another process to remove silicon nitride includes the dry etch removal using halogenated gaseous species, however, the $Si_3N_4$:$SiO_2$ selectivity ratio is even worse than that obtained using the aforementioned wet etch processes.

Accordingly, an object of the present invention to provide improved compositions for the selective removal of silicon nitride materials relative to poly-silicon and/or silicon oxide materials while minimizing the corrosion of metal silicide materials that are present, and not compromising the etch rate of the silicon nitride.

Another object of the present invention relates to the manufacture of self-aligned gate electrodes using said removal compositions.

SUMMARY OF THE INVENTION

The present invention relates to a removal composition and process for selectively etching silicon nitride in the presence of silicon oxide, polysilicon and/or metal silicides, and more particularly to a composition and process for effectively and efficiently etching a layer of silicon nitride at a high etch rate and with high selectivity with respect to exposed or underlying layers of silicon oxide, polysilicon and/or metal silicides, particularly in a multilayer semiconductor wafer structure.

In one aspect, the present invention relates to a silicon nitride removal composition comprising fluorosilicic acid, silicic acid, and at least one organic solvent, wherein said removal composition is suitable for selectively removing silicon nitride material from a microelectronic device wafer having said material thereon.

In another aspect, the present invention relates to a silicon nitride removal composition comprising fluorosilicic acid, silicic acid, at least one organic solvent, and at least one corrosion inhibitor, wherein said removal composition is suitable for selectively removing silicon nitride material from a microelectronic device wafer having said material thereon.

In another aspect, the present invention relates to a silicon nitride removal composition consisting essentially of fluorosilicic acid, silicic acid, at least one organic solvent, and at least one corrosion inhibitor, wherein said removal composition is suitable for selectively removing silicon nitride material from a microelectronic device wafer having said material thereon.

In still another aspect, the present invention relates to a silicon nitride removal composition consisting of fluorosilicic acid, silicic acid, at least one organic solvent, and at least one corrosion inhibitor wherein said removal composition is suitable for selectively removing silicon nitride material from a microelectronic device wafer having said material thereon.

In yet another aspect, the present invention relates to a silicon nitride removal composition comprising fluorosilicic acid and silicic acid, wherein the molar ratio of fluorosilicic acid to silicic acid is in a range from about 3:1 to about 6:1, and wherein said removal composition is suitable for selectively removing silicon nitride material from a microelectronic device wafer having said material thereon.

Another aspect of the invention relates to a kit comprising, in one or more containers, one or more of the following reagents for forming a silicon nitride removal composition, said one or more reagents selected from the group consisting of fluorosilicic acid, silicic acid, at least one organic solvent, and optionally at least one corrosion inhibitor and wherein the kit is adapted to form a composition that selectively removes silicon nitride relative to silicon oxide, polysilicon and/or metal silicides from a microelectronic device having same thereon.

Still another aspect of the invention relates to a method of removing silicon nitride from a microelectronic device, said method comprising contacting the microelectronic device with a removal composition for sufficient time under sufficient conditions to at least partially remove said silicon nitride material from the microelectronic device, wherein the removal composition includes fluorosilicic acid, silicic acid, and at least one organic solvent.

In yet another aspect, the invention relates to a method of removing silicon nitride from a microelectronic device, said method comprising contacting the microelectronic device with a removal composition for sufficient time under sufficient conditions to at least partially remove said silicon nitride material from the microelectronic device, wherein the removal composition includes fluorosilicic acid and silicic acid, wherein the molar ratio of fluorosilicic acid to silicic acid is in a range from about 3:1 to about 6:1.

In a further aspect, the invention relates to a method of making a fluorosilicic acid composition substantially saturated in $SiO_2$, said method comprising:
(a) combining hydrogen fluoride, water, and at least one organic solvent to form a semi-aqueous solution; and
(b) adding tetraethoxysilane to the semi-aqueous solution with stirring and cooling to form a concentrate.

The method may further comprise adding a diluent comprising water and/or at least one organic solvent to obtain the desired concentration of fluorosilicic acid.

Another aspect of the invention relates to an article of manufacture comprising a removal composition, a microelectronic device, and silicon nitride material, wherein the removal composition includes fluorosilicic acid, silicic acid, at least one organic solvent, and optionally at least one corrosion inhibitor.

In a further aspect, the present invention relates to a method of manufacturing a microelectronic device, said method comprising contacting the microelectronic device with removal composition for sufficient time to at least partially remove silicon nitride material from a microelectronic device having same thereon, wherein the removal composition includes fluorosilicic acid, silicic acid, at least one organic solvent, and optionally at least one corrosion inhibitor.

Yet another aspect of the invention relates to improved microelectronic devices, and products incorporating same, made using the methods of the invention comprising removing silicon nitride from the microelectronic device having same thereon, using the methods and/or compositions described herein, and optionally, incorporating the microelectronic device into a product.

Still another aspect of the invention relates to the manufacture of self-aligned gate electrodes using the removal compositions of the invention.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
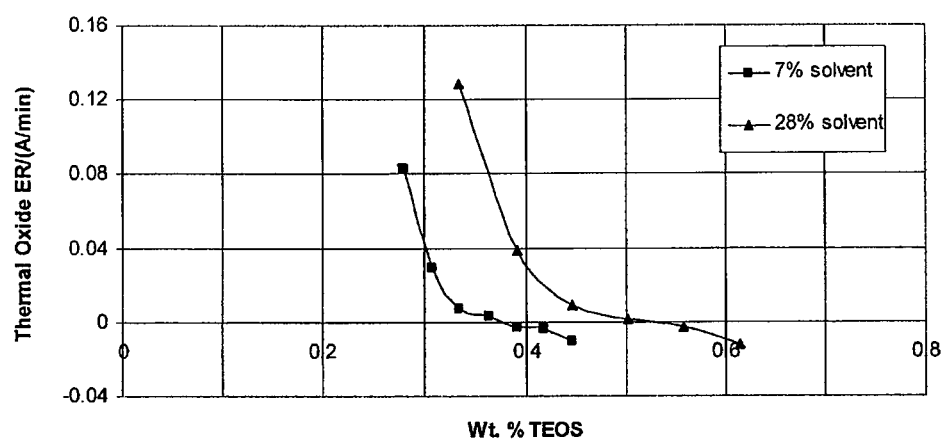
FIG. 1 illustrates the etch rate of thermal oxide in Å min$^{-1}$ in a removal composition of the invention as a function of the weight percent of TEOS and the organic solvent (dipropylene glycol methyl ether).

One aspect of the present invention relates to removal compositions that selectively remove silicon nitride relative to polysilicon (poly-Si) and silicon oxide material deposited from a silicon oxide precursor source, and hence are useful as etchants for at least partial removal of silicon nitride material from a microelectronic device. Metal silicide materials that may be present should not be substantially corroded by said removal compositions.

For ease of reference, "microelectronic device" corresponds to semiconductor substrates, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a negative channel metaloxide semiconductor (nMOS) and/or a positive channel metaloxide semiconductor (pMOS) transistor and will eventually become a microelectronic device or microelectronic assembly.

As used herein, a "gate spacer" is defined as the material that is formed over the sidewalls of a gate electrode and may include multiple layers selected from the group consisting of silicon nitride, silicon oxynitride, CVD oxide from a TEOS source, silicon oxide, boron-silicate glass (BSG), phosphosilicate glass (PSG), borophosphosilicate glass (BPSG), and combinations thereof. Preferably, the gate spacer includes silicon nitride. It should be appreciated that the gate spacer may include one or more layers as required for the specific gate electrode design. The gate spacer acts as a mask material to define the drain and source regions of the pMOS and nMOS during ion implantation and may include a silicided interconnect layer.

As used herein, "suitability" for removing silicon nitride material from a microelectronic device having such nitride material thereon corresponds to at least partial removal of silicon nitride material from the microelectronic device.

As used herein, "silicon nitride" and "$Si_3N_4$" correspond to pure silicon nitride ($Si_3N_4$) as well as impure silicon nitride including hydrogen, carbon and/or oxygen impurities in the crystal structure.

As used herein, "at least partial removal of silicon nitride material" corresponds to the removal of at least a portion of the exposed silicon nitride layer. For example, partial removal of silicon nitride material includes the anisotropic removal of a silicon nitride layer that covers/protects the gate electrodes to form a $Si_3N_4$ sidewall. It is also contemplated herein that the removal compositions of the present invention may be used more generally to substantially remove silicon nitride material relative to poly-silicon and/or silicon oxide layers. In those circumstances, "substantial removal" is defined as preferably at least 90%, more preferably at least 95%, and most preferably at least 99% of the silicon nitride material is removed using the compositions of the invention.

As used herein, "about" is intended to correspond to ±5% of the stated value.

As used herein, "metal silicide" corresponds to any silicide including the species Ni, Pt, Co, Ta, Mo, W, and Ti, including but not limited to $TiSi_2$, NiSi, $CoSi_2$, NiPtSi, tantalum silicide, molybdenum silicide, and tungsten silicide.

As used herein, "hexafluorosilicic acid" and "fluorosilicic acid" may be used interchangeably and correspond to $H_2SiF_6$.

"Silicic acid" is a general name for a family of chemical compounds of silicon, hydrogen, and oxygen, with the general formula $[SiO_x(OH)_{4-2x}]_n$, and includes the compounds metasilicic acid $((H_2SiO_3)_n)$, orthosilicic acid ($H_4SiO_4$), disilicic acid ($H_2Si_2O_5$), and pyrosilicic acid ($H_6Si_2O_7$). Silicic acid can be obtained in many ways well known to those skilled in the art, e.g. by hydrating fine silica powder (preferably 1 µm diameter or less), alkoxysilanes (e.g., tetramethoxysilane (TMOS), tetraethoxysilane (TEOS), tetra-n-propoxysilane, tetra-n-butoxysilane), alkoxysilanes with amino groups (e.g., aminotriethoxysilane, hexaethoxydisilazane), alkoxysilanes with one or more halogen or pseudohalogen groups (e.g., triethoxychlorosilane, triethoxyfluorosilane, triethoxy(isocyanato)silane, diethoxydichlorosilane), or combinations thereof. For ease of reference, "alkoxysilane" will hereinafter be used to include alkoxysilanes, alkoxysilanes with amino groups and alkoxysilanes with one or more halogen or pseudohalogen groups.

It is well understood that "saturation" is the point at which a solution including a solute and a solvent can dissolve no more of the solute and additional amounts of the solute will appear as a precipitate. As defined herein, "substantially saturated" corresponds to a solution concentration ranging from about 30% below saturation to about 30% above saturation. For example, if the saturation of species A in solvent B is 10 g species A in 100 mL solvent B, substantially saturated will correspond to about 7 to about 13 g of species A in 100 mL of solvent B.

As described herein, the silicon oxide layer may be deposited from a silicon oxide precursor source, e.g., TEOS, or may be thermally deposited silicon oxide. Other typical low-k materials include carbon doped oxides (CDO) deposited using commercially available precursors such as SiLK™, AURORA™, CORAL™, or BLACK DIAMOND™, for example using the proprietary BLACK DIAMOND™ process. For the purposes of this invention, "silicon oxide" is meant to broadly include CDO's.

The removal compositions of the present invention must possess good metal compatibility, e.g., a low etch rate on the interconnect metal and/or interconnector metal silicide material. Metals of interest include, but are not limited to, copper, tungsten, cobalt, molybdenum, aluminum, tantalum, titanium and ruthenium. Silicides of interest include any silicide including the species Ni, Pt, Co, Ta, Mo, W, and Ti, including but not limited to $TiSi_2$, NiSi, $CoSi_2$, NiPtSi, tantalum silicide, molybdenum silicide, and tungsten silicide.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In one aspect, the present invention relates broadly to a removal composition for removing silicon nitride material from the surface of a microelectronic device having same thereon, said composition including fluorosilicic acid. More preferably, the present invention relates to a removal composition for removing silicon nitride material from the surface of a microelectronic device having same thereon, said composition including fluorosilicic acid and silicic acid. Even more preferably, the present invention relates to a removal composition for removing silicon nitride material from the surface of a microelectronic device having same thereon, said composition including fluorosilicic acid, silicic acid, and at least one organic solvent. The present invention also relates to a removal composition for removing silicon nitride material from the surface of a microelectronic device having same thereon, said composition including fluorosilicic acid, silicic acid, at least one organic solvent, and at least one corrosion inhibitor. As defined hereinabove, the silicic acid source includes, but is not limited to, fine silica powder, alkoxysilanes, and combinations thereof. In each case, the composition is substantially saturated in silicic acid at the temperature of the removal process.

In one embodiment of this aspect, the removal composition includes fluorosilicic acid and silicic acid having a molar ratio in a range from about 2:1 to about 10:1 (fluorosilicic acid to silicic acid), preferably about 3:1 to about 6:1. It is well known in the art that commercially available fluorosilicic acid is often prepared by methods that leave the as-formed acid in temporary contact with excess solid silica, which is somewhat soluble in the acid. For example:

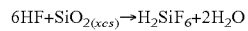

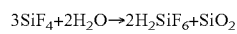

Thus commercially available fluorosilicic acid often includes some amount of $SiO_2$ depending on process details, and as such, the silicic acid in the provided ratio includes the $SiO_2$ found in the commercially prepared fluorosilicic acid in addition to the intentionally added silicic acid. In other words, during compositional production, a larger quantity of silicic acid source must be combined with commercial fluorosilicic acid that has low amounts of $SiO_2$ therein than with commercial fluorosilicic acid that has higher amounts of $SiO_2$ therein, where the amount of $SiO_2$ in commercial fluorosilicic acid varies by lot. The amount of fluorosilicic acid in the compositions of the invention range from about 0.001 wt. % to about 50 wt. %, based on the total weight of the composition. Regardless of the ratio, the composition is preferably substantially saturated in silicic acid at the temperature of the removal process.

The removal composition including fluorosilicic acid and silicic acid having a molar ratio in a range from about 2:1 to about 10:1, preferably about 3:1 to about 6:1, may further include at least one organic solvent present in an amount in a range from about 0.01 wt. % to about 95 wt. %, based on the total weight of the composition. Organic solvents contemplated herein include, but are not limited to, glycols such as ethylene glycol, neopentyl glycol, and 1,2- and 1,3-propylene glycol, their dimers, trimers and tetramers such as dipropylene glycol etc., alcohols such as straight chained or branched $C_2$-$C_6$ alcohols including ethanol, propanol, butanol, pentanol, and hexanol, and glycol ethers such as diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether, propylene glycol monoethyl ether, propylene glycol n-propyl ether, dipropylene glycol n-propyl ether, tripropylene glycol n-propyl ether, propylene glycol n-butyl ether, dipropylene glycol n-butyl ether (DPGBE), tripropylene glycol n-butyl ether, propylene glycol phenyl ether (phenoxy-2-propanol) and combinations thereof. Preferably, the at least one organic solvent comprises DPGME, diethylene glycol methyl ether, propylene glycol, or combinations thereof.

The removal composition including fluorosilicic acid and silicic acid having a molar ratio in a range from about 2:1 to about 10:1, preferably about 3:1 to about 6:1, and at least one organic solvent, may further include at least one corrosion inhibitor. If the microelectronic device includes metal silicides, the metal silicide corrosion inhibitor preferably includes alkoxylated alkynols such as Korantin® PP (BASF, Mount Olive, N.J.); ascorbic acid; alkynols and alkynediols such as propargyl alcohol, 2-butene-1,4-diol, and 2-butyne-1,4-diol; dimethylglyoxime; sulfur compounds such as thianaphthene, thianthrene, 2-mercaptobenzimidazole (MBI), thiosalicylic acid, benzothiazole, thianthrene-1-boronic acid, mercaptobenzothiazole, thiophene carbonitrile, methionine (L- or DL-), L-cysteine. 3-amino-5-mercapto-1,2,4-triazole, 5-amino-1,3,4-thiadiazole-2-thiol, mercaptosuccinic acid, thioctic acid, N-acetyl-L-cysteine, 2-mercapto-1-methylimidazole, 2-mercaptopyridine, 3,3'-thiodipropionic acid, and L-cystine; nitrogen-containing aromatics such as benzotriazole-5-carboxylic acid and imidazole; aminocarboxylic acids such as iminodiacetic acid (IDA); and combinations thereof. Preferably, the metal silicide corrosion inhibitor comprises Korantin® PP, dimethylglyoxime, methionine, and combinations thereof. The metal silicide corrosion inhibitor is present in a range from about 0.001 wt. % to about 5 wt. %, preferably about 0.1 wt. % to about 2 wt. %, based on the total weight of the composition. If the microelectronic device includes nitrides such as TiN or TaN, metal nitride corrosion inhibitors may be added including, but not limited to: phosphonic acids such as nitrilotris (methylene)triphosphonic acid (e.g., Dequest 2000EG, Solutia, Inc., St. Louis, Mo.) 1-hydroxyethylidene-1,1-diphosphonic acid (HEDP), ethylenedinitrilotetra (methylenephosphonic) acid (EDTMP); phosphoric acids such as pyrophosphoric acid; their salts; and combinations thereof. Preferably, the metal nitride corrosion inhibitor is present in a range from about 0.01 wt. % to about 5 wt. %, preferably about 0.1 wt. % to about 2 wt. %, based on the total weight of the composition. It is notable that the phosphonic and phosphoric compounds mentioned above have substantial activity as corrosion inhibitors toward the metal silicide as well, so that for relatively less demanding use (e.g. short etch runs) this latter class of compounds can be used without special metal silicide corrosion inhibitors. In an embodiment, the amount of Dequest 2000 EG used is in a range from about 0.9 wt. % to about 1.8 wt. %, based on the total weight of the composition, regardless of whether any additional corrosion inhibitor(s) are present. Concentrations of Dequest 2000 EG less than about 0.9 wt. % may result in a high etch rate of the nitrides intended to be protected by the Dequest 2000 EG. Interestingly, dimethylglyoxime also exhibits dual activity, protecting both nickel-containing silicides—especially such that possess an oxidized surface—and gate polysilicon. Providing inert gas purging of the solution and an inert gas atmosphere also serves to reduce attack on gate polysilicon.

It is to be appreciated by one skilled in the art that both a metal silicide and a metal nitride corrosion inhibitor may be present in the removal compositions of the invention.

Such removal compositions may optionally include additional components, including active as well as inactive ingredients, e.g., surfactants, stabilizers, reducing agents, chelating agents, oxidizing agents, dispersants, and other additives known to those skilled in the art.

In one embodiment, the removal composition is substantially devoid of abrasive material, e.g., chemical mechanical polishing material, and oxidizing agents such as hydrogen peroxide. As defined herein, "substantially devoid" corresponds to less than about 2 wt. %, more preferably less than 1 wt. %, and most preferably less than 0.1 wt. % of the composition, based on the total weight of said composition.

In another embodiment, any of the removal compositions of the invention may further comprise silicon nitride material residue, wherein the silicon nitride material residue is suspended and/or dissolved in the removal composition.

The removal composition of the present invention including fluorosilicic acid and silicic acid having a molar ratio in a range from about 2:1 to about 10:1, preferably about 3:1 to about 6:1, and at least one organic solvent, may be formulated as a concentrate and diluted prior to use. The at least one corrosion inhibitor, when present, may be a component in the concentrate or it may be added to the removal composition during dilution. It is noted that commercially available fluorosilicic acid provides a source of water to hydrate the silicic acid source, e.g., fine silica powder and/or alkoxysilanes, added to the concentrate. That said, depending on the fluorosilicic acid lot and on the choice of the solvent, additional water (e.g., deionized water) may have to be added to prevent the formation of a two-phase concentrate. In the concentrate, the amount of the at least one organic solvent may be in a range from about 1 wt. % to about 95 wt. %, preferably about 10 wt. % to about 90 wt. %, more preferably about 25 wt. % to about 85 wt. %, and most preferably about 50 wt. % to 85 wt. %, and the amount of fluorosilicic acid per se (i.e., neat fluorosilicic acid, not considering the water or $SiO_2$ typically present in commercial fluorosilicic acid) is in a range from about 0.1 wt. % to about 30 wt. %, more preferably about 0.5 wt. % to about 20 wt. %, and most preferably about 0.5 wt. % to about 15 wt. %, based on the total weight of the concentrate. When present in the concentrate, the amount of the at least one corrosion inhibitor may be in a range from about 0.01 wt. % to about 20 wt. %, more preferably about 0.1 wt. % to about 15 wt. %, based on the total weight of the concentrate. As previously mentioned, the amount of silicic acid source to be added will vary depending on the fluorosilicic acid lot, with the intent of reaching or approaching saturation of the concentrate with $SiO_2$. Substantial oversaturation is not generally desirable because it can cause precipitation of silica on the substrates being cleaned. However, the saturation limit at room temperature can be exceeded slightly because a small amount of excess solid silicic acid that may precipitate on standing at ambient temperatures will redissolve at the typically higher process temperatures. Alternatively, if lower selectivity of silicon nitride material relative to poly-Si and silicon oxides is acceptable, less silicic acid may be added whereby the composition is undersaturated in $SiO_2$.

In the broad practice of the invention, the concentrate of the present invention may comprise, consist of, or consist essentially of: (i) fluorosilicic acid and silicic acid having a molar ratio in a range from about 2:1 to about 10:1, preferably about 3:1 to about 6:1, and at least one organic solvent; (ii) fluorosilicic acid and silicic acid having a ratio in a range from about 2:1 to about 10:1, preferably about 3:1 to about 6:1, at least one organic solvent, and additional water; or (iii) fluorosilicic acid and silicic acid having a ratio in a range from about 2:1 to about 10:1, preferably about 3:1 to about 6:1, at least one organic solvent, additional water, and at least one corrosion inhibitor. In general, the specific proportions and amounts of fluorosilicic acid, silicic acid, organic solvent(s), optional corrosion inhibitor(s), and optional additional water, in relation to each other, may be suitably varied to provide the desired etching action of the removal composition (upon dilution with the diluent) for the silicon nitride material and/or processing equipment, as readily determinable within the skill of the art without undue effort.

In one embodiment of the invention, the concentrate is provided for dilution for use as a removal composition. A concentrated composition, or "concentrate," advantageously permits a user, e.g. a process engineer, to dilute the concentrate at the point of use. The concentrate may be diluted with at least one diluent in a range from about 1:1 to about 50:1 diluent to concentrate, more preferably about 4:1 to about 15:1, and most preferably about 6:1 to about 10:1. Preferably the diluent comprises water and the water is deionized. Alternatively, the diluent may comprise water and at least one water soluble organic solvent including, but not limited to, straight-chained and branched $C_1$-$C_4$ alcohols (e.g., methanol, ethanol, isopropanol, butanol), ethylene glycol, propylene glycol, DPGME, diethylene glycol methyl ether, butyl carbitol, 1,4-butanediol and 1,2-butanediol. Upon dilution, the removal compositions of the invention have pH value in a range from about 0.5 to about 4, and preferably about 1 to about 2.

The removal compositions of the invention may be formulated as follows. The concentrate including TEOS as the silicic acid source may be produced by mixing the components together and aging the concentrate with stirring at 20-25° C. for at least one hour. The concentrate including fine silica powder as the silicic acid source may be produced by mixing the components together and stirring at 20-25° C. for 1-3 days. As previously mentioned, depending on the fluorosilicic acid lot, the amount of silicic acid source necessary to saturate the concentrate with $SiO_2$ will vary, as readily determined by one skilled in the art. If at any time the concentrate separates into two phases, water may be added until a single phase is obtained. The diluted removal compositions of the invention are easily formulated by simple addition of diluent and the respective concentrate and mixing to homogeneous condition. For example, to minimize precipitate formation, the solution concentrate may be stirred for about 1-2 hr after the addition of the silicic acid source (e.g., TEOS) and before dilution with water. Corrosion inhibitors of the phosphonic acid family may be added to the concentrate rather that the diluted composition to further minimize precipitate formation. Corrosion inhibitors that are sparingly soluble in water, e.g. dimethylglyoxime, may also be added to the solvent-rich concentrate rather than to the diluted composition in order to reduce dissolution time.

The removal compositions of the invention may be formulated in the following Formulations A-Q, wherein all percentages are by weight, based on the total weight of the formulation:

Formulation A: 7 wt. % diethylene glycol methyl ether; 3 wt. % fluorosilicic acid (35% in water); 0.0875 wt. % $SiO_2$; 89.91 wt. % water Formulation B: 7 wt. % dipropylene glycol methyl ether; 3 wt. % fluorosilicic acid (35% in water); 0.192 wt. % TEOS; 89.81 wt. % water Formulation C 7 wt. % dipropylene glycol methyl ether; 3 wt. % fluorosilicic acid (35% in water); 0.192 wt. % TEOS; 1 wt. % Korantin® PP; 0.1 wt. % dimethylglyoxime; 88.71 wt. % water Formulation D: 7 wt. % dipropylene glycol methyl ether; 3 wt. % fluorosilicic acid (35% in water); 0.192 wt. % TEOS; 0.3 wt. % Korantin® PP; 0.03 wt. % dimethylglyoxime; 89.48 wt. % water Formulation E: 7 wt. % dipropylene glycol methyl ether; 3 wt. % fluorosilicic acid (35% in water); 0.192 wt. % TEOS; 0.1 wt. % Korantin® PP; 0.03 wt. % dimethylglyoxime; 89.68 wt. % water Formulation F: 70 g dipropyleneglycol methyl ether, 30 g fluorosilicic acid (35%), 0.46 g TEOS Formulation G: 170 g dipropyleneglycol methyl ether, 30 g fluorosilicic acid (35%), 0.46 g TEOS Formulation H: 70 g dipropyleneglycol methyl ether, 30 g fluorosilicic acid (35%), 0.46 g TEOS, 930 g DI water, 1 g Korantin® PP, 0.1 g dimethylglyoxime Formulation I: 70 g dipropyleneglycol methyl ether, 30 g fluorosilicic acid (35%), 0.46 g TEOS, 930 g DI water, 2 g Korantin® PP, 0.05 g dimethylglyoxime, 12 g Dequest 2000EG Formulation J: 70 g dipropyleneglycol methyl ether, 30 g fluorosilicic acid (35%), 0.46 g TEOS, 930 g DI water, 5 g Korantin® PP, 0.25 g dimethylglyoxime, 24 g Dequest 2000EG Formulation K: 170 g dipropyleneglycol methyl ether, 30 g fluorosilicic acid (35%), 0.46 g TEOS, 830 g DI water, 1 g Korantin® PP, 0.1 g dimethylglyoxime Formulation L: 70 g dipropyleneglycol methyl ether, 17.86 g HF (49%), 18.24 g TEOS, 892.86 g DI water, 1 g Korantin PP, 0.1 g dimethylglyoxime Formulation M: 7.1 wt. % DPGME, 3.0 wt. % fluorosilicic acid (35% in water), 1.2 wt. % Dequest 2000 EG, 0.382 wt. % TEOS, 0.2 wt. % Korantin PP, 0.00625 wt. % dimethylglyoxime, 88.1 wt. % water Formulation N: 7.31 wt. % DPGME, 3.1 wt. % fluorosilicic acid (35% in water), 1.2 wt. % Dequest 2000 EG, 0.404 wt. % TEOS, 0.006 wt. % dimethylglyoxime, 87.98 wt. % water Formulation O: 7.31 wt. % DPGME, 3.1 wt. % fluorosilicic acid (35% in water), 1.2 wt. % Dequest 2000 EG, 0.404 wt. % TEOS, 0.006 wt. % dimethylglyoxime, 0.2 wt. % Korantin PP, 87.78 wt. % water Formulation P: 7 wt. % DPGME, 3.0 wt. % fluorosilicic acid (35% in water), 1.2 wt. % Dequest 2000 EG, 1.4 wt. % DL-methionine, 0.28 wt. % TEOS, 0.06 wt. % dimethylglyoxime, 87.06 wt. % water Formulation Q: 7 wt. % DPGME, 3.0 wt. % fluorosilicic acid (35% in water), 1.2 wt. % Dequest 2000 EG, 1.4 wt. % DL-methionine, 0.34 wt. % TEOS, 0.06 wt. % dimethylglyoxime, 87 wt. % water Concentrates of the removal compositions of the invention may be formulated in the following Formulations AA-AD, wherein all percentages are by weight, based on the total weight of the formulation. The concentrates may be diluted as described herein.

Formulation AA: 70 g diethylene glycol methyl ether; 30 g fluorosilicic acid (35% in water); 0.875 g $SiO_2$ Formulation AB: 70 g diethylene glycol methyl ether; 30 g fluorosilicic acid (35% in water); 2.19 g $SiO_2$ Formulation AC: 70 g diethylene glycol methyl ether; 30 g fluorosilicic acid (35% in water); 1.92 g TEOS Formulation AD: 70 g DPGME; 0.60 g dimethylglyoxime (with mixing); 30 g fluorosilicic acid (35% in water); 50 g water; 3.40 g TEOS In a particularly preferred embodiment, the removal composition (or concentrate) of the invention comprises fluorosilicic acid and silicic acid having a molar ratio in a range from about 2:1 to about 10:1, preferably about 3:1 to about 6:1, at least one organic solvent, at least one metal nitride corrosion inhibitor, at least one metal silicide corrosion inhibitor, and water, wherein the weight percent ratio of organic solvent(s) to metal nitride corrosion inhibitor(s) is in a range from about 1:1 to about 10:1, preferably about 4:1 to about 7:1, and the weight percent ratio of metal silicide corrosion inhibitor(s) to metal nitride corrosion inhibitor(s) is in a range from about 1:1 to about 10:1, preferably about 3:1 to about 7:1.

Furthermore, the concentrates may be readily formulated as single-package formulations or multi-part formulations that are mixed at the point of use. The concentrations of the respective ingredients may be widely varied in specific multiples of the removal composition, i.e., more dilute or more concentrated, in the broad practice of the invention, and it will be appreciated that the removal compositions of the invention can variously and alternatively comprise, consist of or consist essentially of any combination of ingredients consistent with the disclosure herein. One embodiment of the invention relates to concentrated formulations containing less than 50 wt % of the diluent to be used in the removal composition, or less than 25%, or less than 10%, or no diluent. Such concentrated formulations are then diluted with the diluent at the fab and/or prior to use at the fab.

Accordingly, another aspect of the invention relates to a kit including, in one or more containers, one or more components adapted to form the removal compositions of the invention. Preferably, the kit includes, in one or more containers, fluorosilicic acid and silicic acid having a molar ratio in a range from about 2:1 to about 10:1 and organic solvent(s) for combining with diluent at the fab. Alternatively, the kit includes, in one or more containers, fluorosilicic acid and silicic acid having a molar ratio in a range from about 2:1 to about 10:1, organic solvent(s), and corrosion inhibitor(s), for combining with said diluent at the fab. It will be appreciated by one skilled in the art that other combinations are contemplated herein. The containers of the kit must be suitable for storing and shipping said removal composition components, for example, NOWPak® containers (Advanced Technology Materials, Inc., Danbury, Conn., USA). The one or more containers which contain the components of the removal composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended removal composition to a process tool. The solution to be stored in NOWPak® or similar containers may optionally be degassed or purged with an inert gas in order to reduce oxidative corrosion of polysilicon and other potentially sensitive materials.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits of the invention, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and U.S. Patent Application No. 60/916,966 entitled "SYSTEMS AND METHODS FOR MATERIAL BLENDING AND DISTRIBUTION" filed on May 9, 2007 in the name of John E. Q. Hughes.

In yet another aspect, the invention relates to methods of etching silicon nitride material from the surface of the microelectronic device having same thereon using the removal compositions described herein. For example, silicon nitride material may be removed without substantially damaging metal and metal silicide interconnect materials. The invention relates to methods of selectively and substantially removing silicon nitride materials relative to polysilicon and/or silicon oxide materials from the surface of the microelectronic device having same thereon using the removal compositions described herein. The metal silicide materials that are present are not substantially corroded by said removal compositions using said method.

In etching application, the removal composition is applied in any suitable manner to the surface of the microelectronic device having the silicon nitride material thereon, e.g., by spraying the removal composition on the surface of the device, by dipping (in a static or dynamic volume of the removal composition) of the device including the silicon nitride material, by contacting the device with another material, e.g., a pad, or fibrous sorbent applicator element, that has the removal composition absorbed thereon, by contacting the device including the silicon nitride material with a circulating removal composition, or by any other suitable means, manner or technique, by which the removal composition is brought into removal contact with the silicon nitride material. The application may be in a batch or single wafer apparatus, for dynamic or static cleaning. In one embodiment, the application of the removal composition to the surface of the microelectronic device is controlled agitation whereby the composition is circulated through the container housing said composition. Active agitation, e.g., turbulence, stirring, etc., is not recommended when the etch rates of silicide and poly-Si are preferably low.

The removal compositions of the present invention, by virtue of their selectivity for silicon nitride material relative to other materials that may be present on the microelectronic device structure and exposed to the removal composition, such as metallization, polysilicon, silicon oxide(s), etc., achieve at least partial removal of the silicon nitride material in a highly efficient and highly selective manner.

In use of the compositions of the invention for removing silicon nitride material from microelectronic device structures having same thereon, the removal composition typically is contacted with the device structure for a sufficient time of from about 1 minute to about 200 minutes, preferably about 15 minutes to about 100 minutes, or about 1 minute to about 2 minutes for a single wafer tool, at sufficient conditions including, but not limited to, a temperature in a range of from about 40° C. to about 120° C., preferably about 60° C. to about 95° C. Such contacting times and temperatures are illustrative, and any other suitable time and temperature conditions may be employed that are efficacious to at least partially remove the silicon nitride material from the device structure, within the broad practice of the invention.

Following the achievement of the desired removal action, the removal composition is readily removed from the microelectronic device to which it has previously been applied, e.g., by rinse, wash, or other removal step(s), as may be desired and efficacious in a given end use application of the compositions of the present invention. For example, the device may be rinsed with a rinse solution including deionized water and/or dried (e.g., spin-dry, $N_2$, vapor-dry etc.).

The removal compositions of the invention selectively etch silicon nitride material relative to poly-Si and silicon oxides from the surface of the microelectronic device without causing substantial corrosion of the metal and/or metal silicide interconnect material(s). For example, the selectivity of silicon nitride to silicon oxide(s) in the presence of the removal compositions of the invention are preferably in a range from about 10:1 to about 7,000:1, more preferably about 30:1 to about 3,000:1, and most preferably about 100:1 to about 2000:1 at temperatures of 40-100° C., preferably 60-95° C., and most preferably 75-90° C. When the silicic acid source includes an alkoxysilane, e.g., TEOS, the selectivity of silicon nitride to silicon oxide(s) can be tuned from about 20:1 to infinity, preferably in the range from about 20:1 to about 7,000:1. In fact, the selectivity is formally negative for fluorosilicic acid/TEOS molar ratios below about 4, reflecting the fact that the thickness of the oxide film is slightly but measurably increased by precipitation of silica. When the silicic acid source includes fine silica powder, the observed selectivity of silicon nitride relative to silicon oxide(s) is in the range of about 20:1 to about 100:1 but higher selectivity may be obtained by longer equilibration times (or higher equilibration temperature) of the silica powder with the fluorosilicic acid.

In another aspect of the invention, the fluorosilicic acid of the removal composition of the invention is produced in situ. Hydrofluoric acid (preferably at concentrations of 40% or higher) and TEOS or other hydrolyzable alkoxysilane may be combined in the appropriate ratio in the at least one organic solvent to form a concentrate having the correct amount of fluorosilicic acid saturated or nearly saturated in $SiO_2$. After aging, the concentrate may be combined with diluent, preferably deionized water, and optionally at least one corrosion inhibitor to form the removal composition having a high selectivity of silicon nitride relative to silicon oxide(s).

Yet another aspect of the invention relates to the improved microelectronic devices made according to the methods of the invention and to products containing such microelectronic devices.

A still further aspect of the invention relates to methods of manufacturing an article comprising a microelectronic device, said method comprising contacting the microelectronic device with a removal composition for sufficient time to etchingly remove silicon nitride material from the surface of the microelectronic device having same thereon, and incorporating said microelectronic device into said article, wherein the removal composition comprises, consists of or consists essentially of fluorosilicic acid, silicic acid, at least one organic solvent, and optionally at least one corrosion inhibitor. The removal composition may further comprise, consist of or consist essentially of silicon nitride material.

Another aspect of the invention relates to an article of manufacture comprising, consisting of or consisting essentially of a microelectronic device substrate, a silicon nitride layer on said substrate, and a removal composition comprising, consisting of or consists essentially of fluorosilicic acid, silicic acid, at least one organic solvent, and optionally at least one corrosion inhibitor.

The features and advantages of the invention are more fully shown by the illustrative examples discussed below.

Example 1

Concentrated formulations were made by combining 15 g fluorosilicic acid, 35 g of DPGME or diethylene glycol methyl ether and 1.52-1.92 g of TEOS or an equivalent amount of 1 micron silica glass powder. The concentrate including TEOS as the silicic acid source is aged by stirring at 20-23° C. for at least 1 hour and then diluted for use as the removal composition of the invention. The concentrate including silica powder is stirred for 1-3 days at room temperature and then diluted for use as the removal composition of the invention. For example, the concentrate may be diluted with deionized water in a 10:1 DI water to concentrate ratio.

Typical etch rates for RTCVD-deposited silicon nitride using removal compositions such as this are in the range of about 7 to about 16 Å $min^{-1}$ at 82-86° C. When TEOS is the silicic acid source, no etching of thermal silicon oxide was detected after 15-22 hours at 85° C. (experimental error is about 1-5 Å).

Example 2

Blanketed RTCVD-deposited $Si_3N_4$ (~850 Å thick) was immersed in Formulations A and B at 80° C. for up to 100 min. The wafers were first measured using an optical interferometer (Nanospec) to determine the pre-immersion thickness, followed by individually immersing each wafer in clean removal composition, pulling the wafers in 25 minute intervals, rinsing with deionized water, blowing dry with nitrogen and post-immersion measuring using the optical interferometer to determine the change in thickness to derive the etch rate of silicon nitride. The results are tabulated in Table 1.

TABLE 1

Etch rate of Silicon Nitride in Formulations A and B.

| Formulation | Time/min | Pre-immersion/Å | Post-immersion/Å | Etch rate/Å $min^{-1}$ |
|---|---|---|---|---|
| A | 25 | 843.1 | 525.975 | 12.685 |
| A | 50 | 841.475 | 229.475 | 12.240 |

TABLE 1-continued

Etch rate of Silicon Nitride in Formulations A and B.

| Formulation | Time/min | Pre-immersion/Å | Post-immersion/Å | Etch rate/Å min$^{-1}$ |
|---|---|---|---|---|
| A | 75 | 837.775 | 83.4 | 10.058 |
| A | 100 | 841.675 | 91.9 | 7.498 |
| B | 25 | 838.7 | 598.9 | 9.592 |
| B | 50 | 844.075 | 344.5 | 9.991 |
| B | 75 | 842.85 | 151.1 | 9.223 |
| B | 100 | 843.625 | 84.45 | 7.592 |

It can be seen that the silicon nitride was completely removed using formulations A and B in about 75 minutes and about 90 minutes, respectively.

In addition, an overnight experiment was performed to determine the etch rate of blanketed thermal $SiO_2$ (~5000 Å thick) in Formulations A and B following immersion therein for about 15 hours at 80° C. The results are tabulated in Table 2.

TABLE 2

Etch rate of Silicon oxide in Formulations A and B.

| Formulation | Pre-immersion/Å | Post-immersion/Å | Etch rate/Å min$^{-1}$ | Selectivity $Si_3N_4/SiO_2$ |
|---|---|---|---|---|
| A | 5045.225 | 4927.95 | 0.126 | ~87 |
| B | 5048.75 | 5045.275 | 0.004 | ~2300 |

In addition to the silicon oxide etch rates, Table 2 includes selectivity results. It can be seen that although formulation B, which includes TEOS as the silicic acid source, etches silicon nitride at a lower rate than formulation A (which includes $SiO_2$ as the silicic acid source), the selectivity of $Si_3N_4/SiO_2$ is substantially greater.

Example 3

Blanketed RTCVD-deposited $Si_3N_4$ (~600 Å thick) was immersed in Formulations B, C, and E at 80° C. for 30 min. The wafers were first measured using an optical interferometer (Nanospec) to determine the pre-immersion thickness, followed by individually immersing each wafer in clean removal composition, pulling the wafers, rinsing with deionized water, blowing dry with nitrogen and post-immersion measuring using the optical interferometer to determine the change in thickness to derive the etch rate of silicon nitride. The results are tabulated in Table 3.

TABLE 3

Etch rate of Silicon Nitride in Formulations B, C and E.

| Formulation | Pre-immersion/Å | Post-immersion/Å | Etch rate/Å min$^{-1}$ |
|---|---|---|---|
| C | 595.95 | 338.48 | 8.58 |
| E | 579.78 | 337.70 | 8.07 |
| B | 627.35 | 391.35 | 7.87 |
| B | 609.85 | 354.10 | 8.53 |
| B | 616.20 | 374.72 | 8.05 |

In addition, blanketed NiPtSi was immersed in the same formulations at 80° C. for 30 minutes and the pre-immersion and post-immersion sheet resistance measured using a four-point probe. The results are tabulated in Table 4.

TABLE 4

Resistivity of NiPtSi in Formulations B, C and E.

| Formulation | Pre-immersion/Ω | Post-immersion/Ω | % change |
|---|---|---|---|
| C | 20.96 | 20.71 | −1.19 |
| E | 19.19 | 19.55 | 1.88 |
| B | 38.01 | 57.70 | 51.80 |
| B | 41.77 | 54.61 | 30.74 |
| B | 82.20 | 123.70 | 50.49 |

It can be seen that the inclusion of Korantin® PP and dimethylglyoxime in Formulations B, C and E did not substantially alter the etch rate of silicon nitride and the corrosion of the metal silicide material was negligible. The formulations including Korantin® PP and dimethylglyoxime also inhibited attack of TaN for about 60 minutes at 85° C.

Example 4

A $SiO_2$ saturated fluorosilicic acid solution was prepared in situ by combining 35 g of DPGME, 5.56 g deionized water and 8.93 g HF (49%) to form a solution and then adding 9.12 g of TEOS dropwise to said solution with vigorous stirring and cooling to form the concentrate. Gelatinous precipitate in the concentrate was dissolved following stirring for 3 days at room temperature. Thereafter, 2.2 g of clear concentrate, 17.74 g DI water, 0.02 g Korantin® PP and 0.04 g 5% dimethylglyoxime in DPGME were combined to form a removal composition having properties similar to those prepared starting with commercial fluorosilicic acid.

Example 5

Blanketed poly-Si was immersed in Formulation H at 80° C. and the etch rate determined. After 30 min and 60 min, the etch rate of the poly-Si was about 0.0048 Å min$^{-1}$ and 0.073 Å min$^{-1}$, respectively.

Example 6

In a separate experiment, it was determined that solutions including dilute fluoroboric acid, with or without peroxide source and boric acid, exhibited relatively high selectivity of $Si_3N_4$ relative to $SiO_2$, however, the $Si_3N_4$ etch rates were low. For example, a 0.39% solution of fluoroboric acid had a selectivity of $Si_3N_4$:$SiO_2$ (thermal) of about 10:1 at 50° C., but an etch rate of $Si_3N_4$ of only 2.5 Å min$^{-1}$. Upon dilution, the etch rate of $Si_3N_4$ increases but at the expense of the selectivity, which decreases.

Example 7

The etch rates of blanketed thermal oxide were determined following immersion at 85° C. for 6 to 24 hr, in formulations having varying concentrations of TEOS at two different organic solvent concentrations. Each formulation included 3 wt. % fluorosilicic acid (35% in water), 1.2 wt. % Dequest 2000 EG, 0.2 wt. % Korantin PP, 0.00625 wt. % dimethylglyoxime, either 7 wt. % DPGME or 28 wt. % DPGME, 0.168 to 0.614 wt. % TEOS (see FIG. 1), and the balance water, based on the total weight of the composition. The wafers were first measured using an optical interferometer (Nanospec) to determine the pre-immersion thickness, followed by individually immersing each wafer in clean removal composition, pulling and rinsing with deionized water, blowing dry with nitrogen and post-immersion measuring using the optical interferometer to determine the change in thickness to derive the etch rate of thermal oxide and silicon nitride. The etch rates of the thermal oxide are shown in FIG. 1.

It can be seen in FIG. 1 that based on the make-up of the formulation, the weight percent of TEOS present may be adjusted to minimize the etch rate of the thermal oxide. Moreover, the amount of organic solvent present affects the TEOS working range. For example, if the preferred etch rate of thermal oxide is to be confined to a range of 0 to about 0.06, the TEOS working range is wider for a high organic solvent concentration than a low organic solvent concentration. Notably, in these cases, while the etch rate of the thermal oxide is negligible, the etch rate of RTCVD silicon nitride is ≥10 Å/min, with a selectivity of $Si_3N_4$ to thermal oxide of at least 160:1. By including a glycol ether solvent, no precipitation of silica on the wafer surface was observed in a wide range of TEOS concentrations. However, such precipitation—observed first as a measurable "negative etch rate" in the thickness measurements results—does occur at high TEOS concentrations (>~0.4% TEOS for the 7% DPGME curve, >~0.55% TEOS for the 28% DPGME curve) when the solution supersaturation in silica becomes too large.

Example 8

Figure 2:
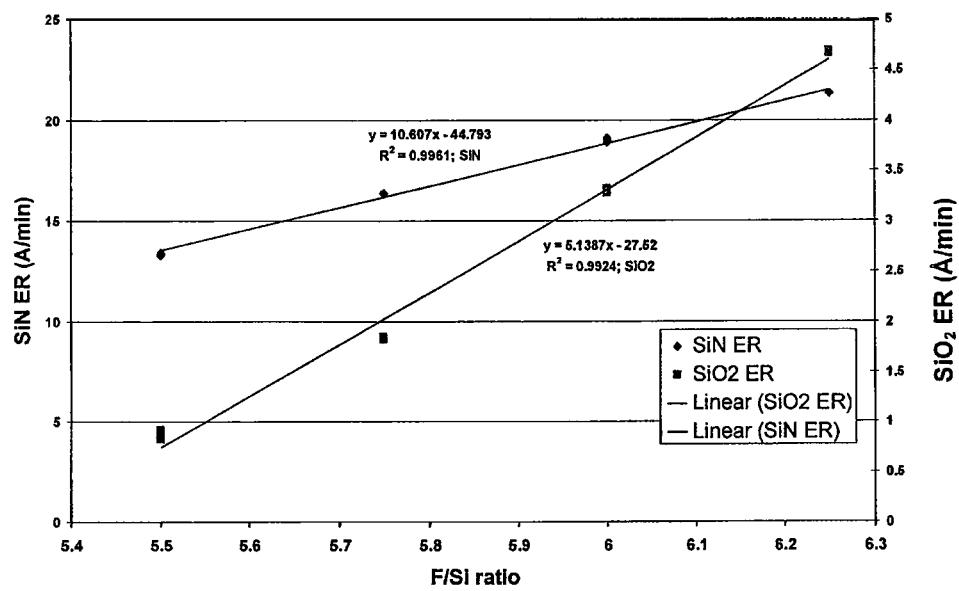
FIG. 2 illustrates the etch rate of silicon nitride and silicon oxide as a function of the F/Si molar ratio.

The exact or substantially exact F/Si molar ratio of the fluorosilicic acid was necessary to determine how much silicic acid, e.g., TEOS, should be added to the formulation to achieve a high selectivity for silicon nitride etch with negligible precipitation of silica. Commercial fluorosilicic acid often has a F/Si molar ratio other than 6.0. A calibration curve can be readily generated to determine the F/Si molar ratio of any commercially purchased fluorosilicic acid. Hydrofluoric acid and TEOS were combined in an aqueous solution to produce F/Si molar ratios of 5.5, 5.75, 6.0 and 6.25, wherein each calibration solution stoichiometrically included 0.85 g of fluorine from the HF source. To solubilize the TEOS, each solution included 8 wt. % ethanol. Blanketed RTCVD-deposited silicon nitride and thermal silicon oxide were immersed in each solution for 30 minutes and the etch rates determined as described generally in Example 7. The etch rates of $Si_3N_4$ and silicon oxide in said calibration solutions are shown in FIG. 2 as well as the best-fit straight lines generated using linear regression. It should be appreciated that the calibration solutions described herein are not limited as such and may be prepared using more or less than 0.85 g of fluorine as well as a different source of silicon and/or organic solvent.

Referring to FIG. 2, an aqueous solution having an unknown F/Si molar ratio comprising 8 wt. % ethanol and 0.85 g fluorine (consistent with the calibration solutions described herein) may be prepared using commercial fluorosilicic acid, as readily determined by one skilled in the art. The aforementioned calibration curve may be prepared and the etch rate of $Si_3N_4$ and/or silicon oxide may be determined using the aqueous solution having an unknown F/Si molar ratio. Using the linear regression equation generated, the exact molar ratio of F/Si may be determined and the amount of silicic acid, e.g., TEOS, that should be added to the removal compositions of the invention may be readily determined.

Notably, the inventors surprisingly discovered that maintaining the F/Si molar ratio constant while doubling the concentration of both fluorosilicic acid and TEOS in a solution had no impact on the etch rate of silicon nitride, which suggests that the F/Si molar ratio, and not the absolute concentration of fluorosilicic acid, controls the etch rate of silicon nitride.

Example 9

A wafer having silicon nitride (deposited using rapid thermal chemical vapor deposition (RTCVD)) thereon was immersed in Formulation M at 85° C. and 100° C. The 100° C. experiment was performed by gently boiling the solution followed by immersion of the blanketed RTCVD $Si_3N_4$ wafer in the solution for 5 and 10 min. The etch rate of the silicon nitride at 100° C. was determined to be approximately 60 Å $min^{-1}$, four times greater than that at 85° C. Notably the etch rate of silicon nitride at 100° C. in formulation M is approximately equal to that achieved in concentrated phosphoric acid at 160° C., which translates to a significant cost savings associated with energy usage.

Example 10

The inventors surprisingly discovered a novel process for preparing high-purity hexafluorosilicic acid in situ using hydrofluoric acid (HF) and alkoxysilane, e.g., TEOS. For example, a quantity of HF and TEOS may be combined with a volatile co-solvent, e.g., ethanol, in an otherwise aqueous solution, wherein the volatile co-solvent may be driven off (e.g., evaporated, boiled, etc.), and optionally replaced by a less volatile co-solvent. In an embodiment, the hexafluorosilicic acid produced using said method is high purity and has a F/Si molar ratio of 6.0.

Alternative alkoxysilanes include tetramethoxysilane (TMOS), tetra-n-propoxysilane, tetrabutoxysilane, tri-methoxyfluorosilane, triethoxyfluorosilane, tri-t-butoxysilanol or combinations thereof.

Example 11

Figure 3:
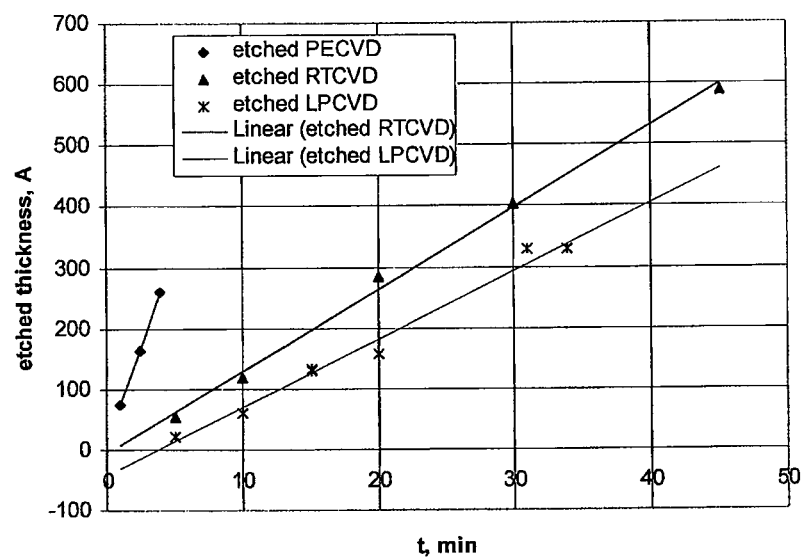
FIG. 3 illustrates the etched thickness of chemical vapor deposited silicon nitride as a function of time using the removal compositions of the invention.

Wafers having blanketed silicon nitride were immersed in formulation M at 85° C. and the etch rate was determined analogous to Example 7. Three different silicon nitride samples were tested: RTCVD silicon nitride; plasma enhanced chemical vapor deposition (PECVD) silicon nitride; and low temperature chemical vapor deposition (LPCVD) silicon nitride. The results are shown in FIG. 3, where it can be seen that the etch rate of the silicon nitride was strongly dependent on how the silicon nitride was deposited on the substrate. Notably, the PECVD nitride was etched at rates exceeding 60 Å/min, much faster than the other two types, and the LPCVD nitride etched slightly slower than the RTCVD nitride.

Example 12

Blanketed polysilicon was immersed in formulations N and O, wherein formulation N does not include Korantin PP, at 85° C. for 62 min. The etch rates of the polysilicon were determined analogous to Example 7, whereby the etch rate in Formulation N and O was 0.129 and 0.339 Å $min^{-1}$, respectively. In other words, the polysilicon etch rate is lower in the composition that does not include the Korantin PP.

Example 13

Blanketed poly-Si samples, undoped, n-doped and p-doped, were statically immersed in Formulation Q for 1 hr at 85° C., with and without nitrogen gas bubbling. The doped samples treated under a reduced oxygen atmosphere (i.e., with nitrogen bubbling) showed lower etch rates of poly-Si, by 20-30 Å $hr^{-1}$, relative to the doped samples not treated in a reduced oxygen atmosphere. As such, the use of an inert gas or an oxygen scavenger may further reduce the etch rate of poly-Si in the presence of compositions of the invention.

Example 14

The sheet resistance change for undoped, n-doped and p-doped forming gas (FG)-annealed NiPtSi were determined following treatment in Formulations P and Q for 60 minutes at 85° C. By definition, "forming gas" corresponds to nitrogen gas with a small percentage of hydrogen gas therein, typically about 4-5%. The results are tabulated in Table 5.

TABLE 4

Sheet Resistance Change of NiPtSi in Formulations P and Q.

| substrate | % resistance change for formulation | |
|---|---|---|
| | P | Q |
| undoped NiPtSi | +14.5% | +6% |
| n-doped NiPtSi | >1000% (film dissolution) | 0% |
| p-doped NiPtSi | +4.3% | +0.6% |

It can be seen that the corrosion of the metal silicide material was negligible in the presence of formulation Q. Of note, the dissolved silicic acid in formulation Q is near saturation and reduced the rate of silicide etch relative to formulation P, which was more undersaturated in silicic acid.

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A silicon nitride removal composition comprising fluorosilicic acid, silicic acid, at least one corrosion inhibitor, and at least one organic solvent, wherein the source of silicic acid is an alkoxysilane, wherein the at least one organic solvent comprises a glycol, a glycol ether, or a combination thereof, and wherein the molar ratio of fluorosilicic acid to silicic acid is in a range from about 3:1 to about 6:1.

2. The composition of claim 1, wherein the alkoxysilane comprises a species selected from the group consisting of tetramethoxysilane (TMOS), tetraethoxysilane (TEOS), tetra-n-propoxysilane, tetrabutoxysilane, aminotriethoxysilane, hexaethoxydisilazane, triethoxychlorosilane, triethoxyfluorosilane, triethoxy(isocyanato)silane, diethoxydichlorosilane, and combinations thereof.

3. The composition of claim 1, wherein the at least one organic solvent comprises a species selected from the group consisting of ethylene glycol, neopentyl glycol, 1,2-propylene glycol, 1,3-propylene glycol, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether, propylene glycol monoethyl ether, propylene glycol n-propyl ether, dipropylene glycol n-propyl ether, tripropylene glycol n-propyl ether, propylene glycol n-butyl ether, dipropylene glycol n-butyl ether (DPGBE), tripropylene glycol n-butyl ether, propylene glycol phenyl ether (phenoxy-2-propanol), and combinations thereof.

4. The composition of claim 1, wherein said removal composition is suitable for selectively removing silicon nitride material from a microelectronic device wafer having said material thereon.

5. The composition of claim 1, wherein the at least one corrosion inhibitor comprises a species selected from the group consisting of alkoxylated alkynols, sulfur compounds, nitrogen-containing aromatics, aminocarboxylic acids, phosphonic acids, phosphoric acids, and combinations thereof.

6. The composition of claim 1, wherein the at least one corrosion inhibitor comprises a species selected from the group consisting of alkoxylated alkynols, ascorbic acid, propargyl alcohol, 2-butene-1,4-diol, 2-butyne-1,4-diol, dimethylglyoxime, thianaphthene, thianthrene, 2-mercaptobenzimidazole (MBI), thiosalicylic acid, benzothiazole, thianthrene-1-boronic acid, mercaptobenzothiazole, thiophene carbonitrile, L-methionine, DL-methionine, L-cysteine, 3-amino-5-mercapto-1,2,4-triazole, 5-amino-1,3,4-thiadiazole-2-thiol, mercaptosuccinic acid, thioctic acid, N-acetyl-L-cysteine, 2-mercapto-1-methylimidazole, 2-mercaptopyridine, 3,3'-thiodipropionic acid, L-cystine, benzotriazole-5-carboxylic acid, imidazole, iminodiacetic acid (IDA), nitrilotris(methylene)triphosphonic acid, 1-hydroxyethylidene-1,1-diphosphonic acid (HEDP), ethylenedinitrilotetra(methylenephosphonic) acid (EDTMP), pyrophosphoric acid, salts thereof, and combinations thereof.

7. The composition of claim 1, further comprising at least one diluent.

8. The composition of claim 7, wherein the diluent comprises water.

9. The composition of claim 7, wherein the diluent is combined with a concentrate in a ratio of about 5:1 to about 15:1 to form the removal composition.

10. The composition of claim 7, wherein the pH is in a range from about 0.5 to about 4.

11. The composition of claim 1, wherein the composition is substantially devoid of chemical mechanical polishing abrasive material and oxidizing agents.

12. A method of removing silicon nitride from a microelectronic device, said method comprising contacting the microelectronic device with a removal composition for sufficient time under sufficient conditions to at least partially remove said silicon nitride material from the microelectronic device, wherein the removal composition includes fluorosilicic acid, silicic acid, at least one organic solvent, and at least one corrosion inhibitor, wherein the source of silicic acid is an alkoxysilane, wherein the at least one organic solvent comprises a glycol, a glycol ether, or a combination thereof, and wherein the molar ratio of fluorosilicic acid to silicic acid is in a range from about 3:1 to about 6:1.

13. The method of claim 12, wherein said contacting comprises at least one condition selected from the group consisting of: time of from about 1 minute to about 200 minutes; temperature in a range of from about 40° C. to about 120° C.; and combinations thereof.

14. The method of claim 12, wherein the alkoxysilane comprises a species selected from the group consisting of tetramethoxysilane (TMOS), tetraethoxysilane (TEOS), tetra-n-propoxysilane, tetrabutoxysilane, aminotriethoxysilane, hexaethoxydisilazane, triethoxychlorosilane, triethoxyfluorosilane, triethoxy(isocyanato)silane, diethoxydichlorosilane, and combinations thereof.

15. The method of claim 12, wherein the at least one organic solvent comprises a species selected from the group consisting of ethylene glycol, neopentyl glycol, propylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether, propylene glycol monoethyl ether, propylene glycol n-propyl ether, dipropylene glycol n-propyl ether, tripropylene glycol n-propyl ether, propylene glycol n-butyl ether, dipropylene glycol n-butyl ether (DPGBE), tripropylene glycol n-butyl ether, propylene glycol phenyl ether (phenoxy-2-propanol), and combinations thereof.

16. The method of claim 12, wherein the at least one corrosion inhibitor comprises a species selected from the group consisting of alkoxylated alkynols, ascorbic acid, propargyl alcohol, 2-butene-1,4-diol, 2-butyne-1,4-diol, dimethylglyoxime, thianaphthene, thianthrene, 2-mercaptobenzimidazole (MBI), thiosalicylic acid, benzothiazole, thianthrene-1-boronic acid, mercaptobenzothiazole, thiophene carbonitrile, L-methionine, DL-methionine, L-cysteine, 3-amino-5-mercapto-1,2,4-triazole, 5-amino-1,3,4-thiadiazole-2-thiol, mercaptosuccinic acid, thioctic acid, N-acetyl-L-cysteine, 2-mercapto-1-methylimidazole, 2-mercaptopyridine, 3,3'-thiodipropionic acid, L-cystine, benzotriazole-5-carboxylic acid, imidazole, iminodiacetic acid (IDA), nitrilotris(methylene)triphosphonic acid, 1-hydroxyethylidene-1,1-diphosphonic acid (HEDP), ethylenedinitrilotetra(methylenephosphonic) acid (EDTMP), pyrophosphoric acid, salts thereof, and combinations thereof.

17. The method of claim 12, wherein the removal composition further comprises at least one diluent, wherein the at least one diluent comprises water.

\* \* \* \* \*